(12) United States Patent
Hamada et al.

(10) Patent No.: US 6,936,959 B2
(45) Date of Patent: Aug. 30, 2005

(54) DISPLAY APPARATUS

(75) Inventors: Hiroki Hamada, Hirakata (JP); Daisuke Ide, Gifu (JP); Koji Suzuki, Aichi (JP)

(73) Assignee: Sanyo Electric Co., Ltd., Osaka (JP)

( * ) Notice: Subject to any disclaimer, the term of this patent is extended or adjusted under 35 U.S.C. 154(b) by 334 days.

(21) Appl. No.: 10/338,644

(22) Filed: Jan. 9, 2003

(65) Prior Publication Data

US 2003/0141812 A1 Jul. 31, 2003

(30) Foreign Application Priority Data

Jan. 25, 2002 (JP) ......................... 2002-017727

(51) Int. Cl.⁷ ................. H05B 33/26; H05B 33/14; G09F 9/30
(52) U.S. Cl. ................. 313/506; 313/503; 313/498; 313/633
(58) Field of Search ................. 313/498–506, 313/509, 574, 633, 326, 311; 428/917, 417, 418, 425.6, 432, 433, 690; 359/254, 266; 345/76

(56) References Cited

U.S. PATENT DOCUMENTS

| | | | |
|---|---|---|---|
| 3,662,210 A | * | 5/1972 | Maximov ................. 428/656 |
| 5,517,080 A | * | 5/1996 | Budzilek et al. ............ 313/509 |
| 5,780,351 A | | 7/1998 | Arita et al. |
| 5,945,008 A | | 8/1999 | Kisakibaru et al. |
| 6,075,319 A | * | 6/2000 | Kanda et al. ................ 313/584 |
| 6,093,934 A | | 7/2000 | Yamazaki et al. |
| 6,124,604 A | | 9/2000 | Koyama et al. |
| 6,281,552 B1 | | 8/2001 | Kawasaki et al. |
| 6,333,528 B1 | | 12/2001 | Arita et al. |
| 6,356,029 B1 | | 3/2002 | Hunter |
| 6,489,046 B1 | | 12/2002 | Ikeda et al. |
| 6,501,466 B1 | | 12/2002 | Yamagishi et al. |
| 6,525,704 B1 | | 2/2003 | Kondo et al. |
| 6,528,824 B2 | | 3/2003 | Yamagata et al. |
| 6,579,787 B2 | | 6/2003 | Okura et al. |
| 6,583,581 B2 | | 6/2003 | Kaneko et al. |
| 6,686,693 B1 | * | 2/2004 | Ogawa ....................... 313/505 |
| 6,717,181 B2 | | 4/2004 | Murakami et al. |
| 2002/0190256 A1 | | 12/2002 | Murakami et al. |
| 2003/0124042 A1 | | 7/2003 | Nakazawa et al. |
| 2003/0129321 A1 | | 7/2003 | Aoki |

FOREIGN PATENT DOCUMENTS

| | | |
|---|---|---|
| CN | 1214799 A | 4/1999 |
| CN | 1223014 A | 7/1999 |
| JP | 02-039536 | 2/1990 |
| JP | 10-170955 | 6/1998 |
| JP | 10-199827 | 7/1998 |
| JP | 11-111990 | 4/1999 |
| JP | 2000-236097 | 8/2000 |
| JP | 2000-277607 | 10/2000 |
| JP | 2000-347621 | 12/2000 |
| JP | 2000-347621 A | 12/2000 |
| JP | 2000-349298 | 12/2000 |
| JP | 2001-56667 | 2/2001 |
| JP | 2001-308094 | 11/2001 |
| JP | 2001-350449 | 12/2001 |
| JP | 2002-040963 A | 2/2002 |
| JP | 2003-195811 | 7/2003 |
| WO | WO 97/36324 | 10/1997 |
| WO | WO 98/36407 | 8/1998 |
| WO | WO 98/45881 | 10/1998 |
| WO | WO 01/06484 A1 | 1/2001 |
| WO | WO 01/75852 A1 | 10/2001 |

* cited by examiner

Primary Examiner—Ashok Patel
(74) Attorney, Agent, or Firm—McDermott Will & Emery LLP

(57) ABSTRACT

A first molybdenum layer made of a molybdenum film, an aluminum conductive layer made of an aluminum-neodymium alloy film, a second molybdenum layer made of a molybdenum film and an insulating film layer made of a silicon dioxide film are stacked, in this order from the bottom to the top, on an insulating substrate made of glass.

20 Claims, 8 Drawing Sheets

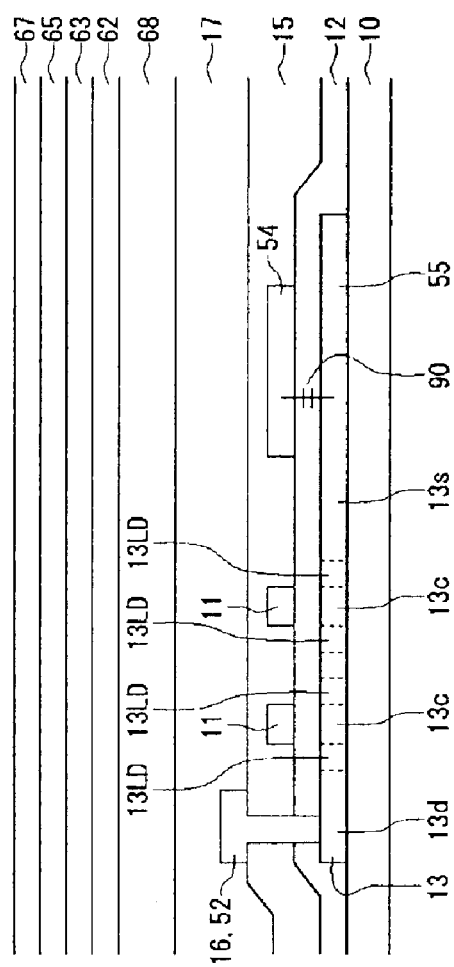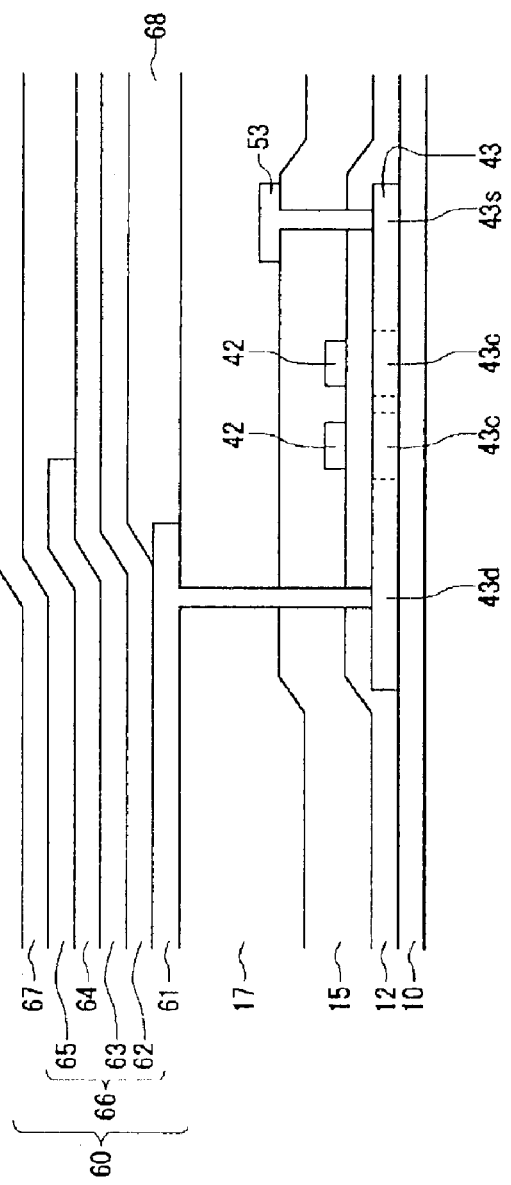

DISPLAY APPARATUS

BACKGROUND OF THE INVENTION

1. Field of the Invention

The present invention relates to a display apparatus.

2. Description of the Related Art

It is expected that the organic electroluminescent (EL) display apparatus, as a display apparatus, shall replace currently widespread liquid crystal display apparatus, and the development of the organic EL display apparatus for practical use is advancing. In particular, active-matrix type organic electroluminescent display apparatus (hereinafter referred to simply as "organic EL display apparatus" also) equipped with thin film transistors (hereinafter simply abbreviated as "TFT") that serve as switching elements are considered to play a leading role as next-generation flat panel display apparatus.

As shown in FIG. 7, an organic EL display apparatus has display pixels disposed in a matrix in a display area 200 on an insulating substrate 10. Moreover, as will be described later in detail in preferred embodiments, each display pixel includes an organic EL element which is laminated in order with an anode, organic material and a cathode, and a TFT which drives the organic EL element. Also, provided in the periphery of the display area 200 are a scanning driver 210 that outputs scanning signals and a luminance data driver 220 that outputs luminance data to be set in respective display pixels. Furthermore, various signals to be supplied to the organic EL element are inputted from a first terminal 100 and second terminals 100*a* disposed on one end of the periphery of the display area 200.

A wiring structure which is utilized for the input of signals to display pixels of such a display apparatus is disclosed in Japanese Patent Application Laid-Open No. 2001-282136. FIGS. 8A and 8B illustrate examples of such a wiring structure. FIG. 8A is a cross-sectional view along line A—A in FIG. 7, showing the vicinity of terminal regions that supply voltage to the cathode.

As shown in FIG. 8A, the first terminal 100 and second terminals 100*a*, which are all made of aluminum, are formed on the insulating substrate 10. The first terminal 100 feeds voltage to a cathode 67, and the second terminals 100*a* function as signal input terminals for parts other than the cathode 67.

An interlayer insulating film 15 is disposed between terminals, and an ITO (Indium Tin Oxide) film 61*a* is laminated on each of the aluminum terminals. This ITO film 61*a* is placed simultaneously with the formation of the anode of the organic EL element. The ITO film 61*a* is further laminated with a cathode material which connects the ITO film 61*a* to the cathode 67.

Here, the ITO film 61*a* is formed to prevent the aluminum terminals from being etched when the anodes of organic EL elements are etched in a manner of islands for the respective display pixels. This ITO film 61*a* thus protects the first terminal 100 and second terminals 100*a* from being etched.

Moreover, the structure shown in FIG. 8B is a structure that features a lowered contact resistance by providing a refractory metal 70 between the ITO film 61*a* and the terminal 100 of the wiring structure shown in FIG. 8A. In this structure, the refractory metal 70 is laminated on the first terminal 100 by a sputtering or like method after the formation of the first terminal 100.

It is to be noted that the organic EL display apparatus, whose optical elements are of the current-driven type, requires higher reliability for their wiring than the display apparatus such as liquid crystal display apparatus whose optical elements are of the voltage-driven type.

While reduction in contact resistance is realized by the conventional structure as shown in FIG. 8B, there are still demands for materials and wiring structures that excel in resistance to electromigration or stressmigration.

SUMMARY OF THE INVENTION

The present invention has been made in view of the foregoing circumstances and an object thereof is to provide a display apparatus that has a wiring structure featuring high resistance to above-mentioned electromigration and stressmigration.

A preferred embodiment according to the present invention relates to a display apparatus. This display apparatus includes a multi-layer structured wiring which comprises: an insulating substrate; a first conductive layer, formed on the insulating substrate, which is made of a refractory metal; a second conductive layer, formed on the first conductive layer, which is made of an aluminum alloy; and a third conductive layer, formed on the second conductive layer, which is made of a refractory metal.

In other words, the aluminum alloy is sandwiched by refractory metals and the wiring thus becomes multi-layer structured, so that the migration resistance of the aluminum alloy improves. Here, the refractory metal may be a metal such as molybdenum, chrome or tungsten that belongs to group 6A. Such metals belonging to group 6A exhibits small diffusion into the aluminum alloy.

Normally, the current flows through the aluminum alloy whose value of resistance is lower than that of the refractory metal layer, and heat is then generated, so that it is desirable that this heat be released. Since the heat conduction in the insulating substrate is generally small, the refractory metal which is expected to exhibit heat dissipation effect is used in the first conducive layer. Thereby, generation of stressmigration, in the second conductive layer, caused by thermal stress can be suppressed. On the other hand, the third conductive layer has functions which serve as a protective film for the second conductive layer and which suppress contact resistance with terminals such as an ITO.

Here, as examples for the wiring, there are a data signal line to which luminance data to be set to each display pixel is applied, a scanning line to which a timing signal for writing the luminance data is applied and a drive power line which supplies power to an optical element equipped in each pixel, but not limited thereto. Moreover, an interstitial layer may be each provided between the insulating substrate and the first conductive layer, between the first conductive layer and the second conductive layer, and between the second conductive layer and the third conducive layer. The insulating substrate may be exemplified by a substrate made of quartz glass, no-alkali glass or like material, but is not limited thereto.

Moreover, the metal belonging to group 6A may be molybdenum alone or molybdenum alloy. It is to be noted that a processing of molybdenum is relatively easy particularly in its fabrication process.

In general, this wiring structure is used for a wiring structure of active-matrix type display apparatus which utilizes low-temperature polysilicon TFT or the like. However, the usage of this wiring structure is not limited thereto, and this wiring structure may be used for a line-electrode anode or cathode in a passive type display apparatus, or may be used for wiring of a display apparatus that widely uses an MIS (Metal Insulator Semiconductor).

Moreover, the aluminum alloy in the second conductive layer may be an aluminum-neodymium alloy that contains a neodymium element. Moreover, the content of the neodymium concentration may be greater than or equal to 2 atomic %. The inclusion of a neodymium element into the aluminum can suppress occurrence of the electromigration. In the conventional practice, doping of elements such as neodymium is likely to be minimized whenever possible, in consideration of increase in resistivity of the aluminum alloy.

However, in the case where the optical elements are of the current-driven type as in the organic EL display apparatus, higher reliability for the wiring is required compared to a display apparatus such as a liquid crystal display apparatus whose optical elements are of voltage-driven type. Inclusion of neodymium of 2% or greater into the aluminum can improve resistance to the electromigration, so that the wiring suitable for the display apparatus whose optical elements are of current-driven type is obtained.

Moreover, although the upper limit is not particularly set for the concentration, less than or equal to 10 atomic % may be preferable, for instance, and less than or equal to 5 atomic % may be further preferable. This upper limit depends on a size of a display panel that utilizes this wiring scheme. In other words, there is concern that desired signals could not be inputted to the pixels because the wiring is long and potential difference at both ends are large in the case when the resitivity is large and the size of the display panel to be used is large. Thus, if this wiring structure is to be applied to the large-size display panel, the neodymium concentration contained in the aluminum alloy will be suppressed to a low level.

Moreover, a weight-converted concentration of iron contained in the second conductive layer as impurity may be in a range of approximately 50 ppm to 200 ppm. In general, when the impurity is contained in the wiring, the resitivity of the wiring increases. However, if a very small amount of iron is contained within the above-described range, the resitivity drops due to the pinning effect.

Moreover, concentrations of oxygen, nitrogen and carbon elements contained in the second conductive layer as impurities may be approximately less than or equal to $1 \times 10^{20}$ cm$^{-3}$, $5 \times 10^{19}$ cm$^{-3}$, and $1 \times 10^{19}$ cm$^{-3}$, respectively. If the contents of the respective elements are too high, the resistivity will rise. That is why it is preferable that concentrations of oxygen, nitrogen and carbon elements be suppressed to the respective values as described above.

Moreover, the wiring may be connected to a current-driven type optical element. As described above, this wiring structure is particularly effective in the case when the optical element as in the organic EL display apparatus or an inorganic EL display apparatus is of current driven type.

According to the present invention as described above, generation of the stressmigration can be suppressed by providing the refractory metal, such as the first conductive layer utilizing molybdenum in particular, between the insulating substrate and the second conductive layer made of aluminum alloy. Moreover, the contact resistance caused when the second conductive layer is to be connected to external terminals can be suppressed by providing the refractory metal on the second conductive layer.

Moreover, that the aluminum alloy in the second conductive layer is aluminum-neodymium alloy containing a neodymium element whose concentration is greater than or equal to 2 atomic % results in suppressing the occurrence of the electromigration. Then, the resistivity of the wiring rises and the heat generation is conspicuous. Thus, effective is the provision of the molybdenum layer between the insulating substrate and the aluminum alloy, as described above. Moreover, by combining these characteristics, the wiring structure which is significantly effective for the display apparatus such as an organic EL display apparatus or inorganic EL display apparatus in particular whose optical elements are of the current-driven type can be realized.

It is to be noted that any arbitrary combination or rearrangement of the above-described structural components, and so forth are all effective as and encompassed by the present embodiments.

Moreover, this summary of the invention does not necessarily describe all necessary features so that the invention may also be sub-combination of these described features.

BRIEF DESCRIPTION OF THE DRAWINGS

FIG. 3A shows a cross-sectional view of the display pixel of the active-matrix type organic EL display apparatus, along line A—A in FIG. 2.

FIG. 3B shows a cross-sectional view of the display pixel of the active-matrix type organic EL display apparatus, along line B—B in FIG. 2.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

Figure 2:
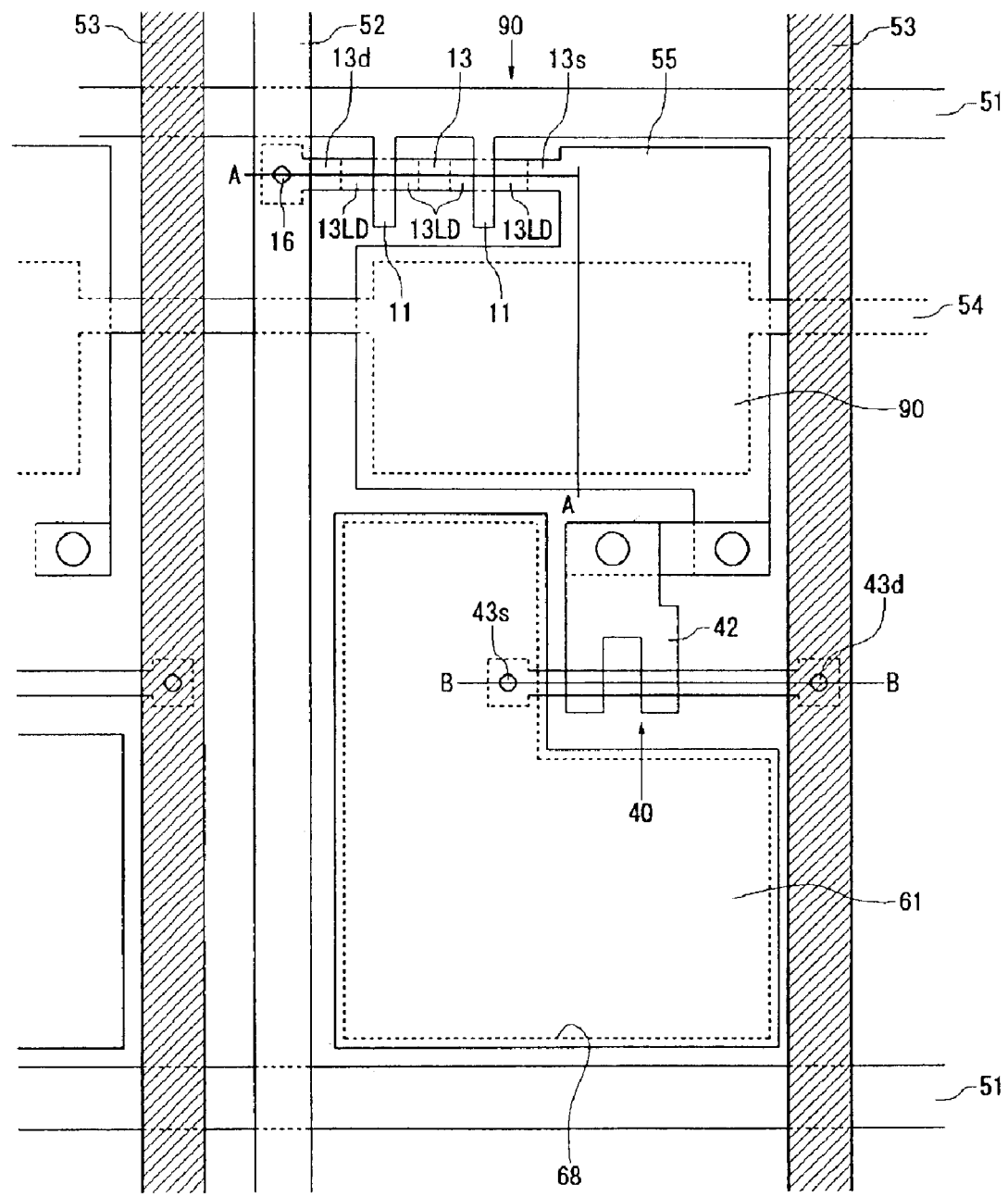
FIG. 2 shows a plan view of a display pixel of an active-matrix type organic EL display apparatus according to an embodiment of the present invention.

First, the general structure of display pixels of organic EL display apparatus is described. FIG. 2 shows a plan view of a display pixel of an organic EL display apparatus. FIG. 3A shows a cross-sectional view along line A—A in FIG. 2, and FIG. 3B shows a cross-sectional view along line B—B in FIG. 2.

Referring to FIG. 2, the display pixel is formed in an area enclosed by gate signal lines 51 and drain signal lines 52. Near the above left point of intersection of these signal lines, there is provided a first TFT 30 which is a switching element. A source electrode 13s of the first TFT 30 serves also as a capacitance electrode 55, which is a capacitance together with a storage capacitance electrode 54 (described later), and is connected to a gate electrode 42 of a second TFT 40 which drives the organic EL element 60. A source electrode 43s of the second TFT 40 is connected to an anode 61 of the organic EL element, and a drain electrode 43d thereof is connected to a drive power line 53 which is connected to drive power supply that drives the organic EL element.

Moreover, the storage capacitance electrode 54 is disposed in parallel with the gate signal line 51 in an area interposed between the two TFTs. This storage capacitance electrode 54, which is made of chrome or like material, serves as and is formed into a storage capacitance 90 by storing electric charge between the storage capacitance electrode 54 itself and the capacitance electrode 55, which is formed integrally with the source electrode 13s of the first TFT 30 via a gate insulating film. This storage capacitance 90 is provided to store the voltage applied to the gate electrode 42 of the second TFT 40.

The first TFT 30 is described hereunder with reference to FIG. 3A. An active layer 13, which comprises a polycrystalline silicon film having been polycrystallized by laser irradiation to amorphous silicon film, is formed on an insulating substrate 10 made of quartz glass, no-alkali glass or like material. In this active layer 13, a so-called LDD (Lightly Doped Drain) structure is provided. Namely, low-density regions 13LDs are provided on both sides of a gate electrode 11, and a source electrode 13s and a drain electrode 13d which are high-density regions are provided outside the 13LDs. Also, a channel 13c is provided in a region between the low-density regions 13LDs directly below the gate electrode 11.

The gate insulating film 12 is formed on the active layers 13, and the gate electrodes 11 which is made of a refractory metal such as chrome or molybdenum and constitute part of the gate signal line 51 shown in FIG. 2 are formed further on the gate insulating film 12. At this time, the storage capacitance electrode 54 is formed simultaneously.

Then an interlayer insulating film 15, which is laminated with $SiO_2$ film, SiN film and $SiO_2$ film in this order, is provided on the gate electrodes 11 and the whole surface of the gate insulating film 12. Moreover, a drain electrode 16 is provided which is made of aluminum or like metal filled in a contact hole provided corresponding to the drain electrode 13d and constitutes part of the drain signal line 52. Further provided on the whole surface thereof is a planarization insulating film 17 which is made of an organic resin, for instance, and which flattens the surface. Furthermore, an insulating film 68, a first hole transporting layer 62, a second hole transporting layer 63, an electron transporting layer 65 and a cathode 67 are laminated further on the insulating film 17.

Next, a second TFT 40 which is a TFT to drive an organic EL element 60 is described hereunder with reference to FIG. 3B. Simultaneously with the formation of the active layer 13 of the first TFT 30, an active layer 43 which is a polycrystalline silicon film is formed on an insulating substrate 10. In the active layer 43, intrinsic or substantially intrinsic channels 43c are provided below gate electrodes 42, and on each side of the channels 43c, a source electrode 43s and a drain electrode 43d, respectively, are provided by applying ion doping of p-type impurity, thus forming a p-type channel TFT. Further provided on the active layer 43 are a gate insulating film 12 and gate electrodes 42 made of a refractory metal such as chrome or molybdenum. The gate electrodes 42 are connected to the source electrode 13s of the first TFT 30.

Then an interlayer insulating film 15, which is laminated with $SiO_2$ film, SiN film and $SiO_2$ film in this order from bottom to top thereof, is formed on the whole surfaces of the gate insulating film 12 and the gate electrodes 42, and a drive power line 53 is disposed which is made of aluminum or like metal filled in the contact hole provided corresponding to the drain electrode 43d and is connected to a drive power supply. Further provided on the whole surface thereof is a planarization insulating film 17 which is made of an organic resin, for instance, and which flattens the surface. Now a contact hole is formed in a position of the planarization insulating film 17 which corresponds to the source electrode 43s. Then the anode 61 of the organic EL element 60, which is a transparent electrode of ITO (Indium Tin Oxide) in contact with the source electrode 43s via this contact hole, is provided on the planarization insulating film 17.

The organic EL element 60 has a structure comprising an anode 61, which is a transparent electrode made of ITO or like material, an luminescent element layer 66, and a cathode 67 made of magnesium-indium alloy, which are stacked in this order from bottom to top thereof. Also, the luminescent element layer 66 has a structure comprising a first hole transporting layer 62 made of MTDATA (4,4',4"-tris(3-methylphenylphenylamino)triphenylamine), a second hole transporting layer 63 made of TPD (N,N'-diphenyl-N,N'-di (3-methylphenyl)-1,1'-biphenyl-4,4'-diamine), a luminescent layer 64 made of Bebq2 (bis(10-hydroxybenzo[h] quinolinato)beryllium) containing a quinacridone derivative, and an electron transporting layer 65 made of Bebq2, which are stacked in this order from bottom to top thereof.

These first hole transporting layer 62, second hole transporting layer 63, electron transporting layer 65 and cathode 67 are formed commonly in the organic EL element 60 provided in each display pixel. The luminescent layer 64 is formed in a manner of islands corresponding to the anode 61. Moreover, an insulating film 68 (outside the region indicated by a dotted line) is formed in the periphery of the anode 61. The provision of this film 68 is designed to prevent the short-circuiting, between the cathode 67 and the anode 61, which may be caused by a break or cutoff of the luminescent element layer 66 due to the level difference resulting from the thickness of the anode 61. Then the materials of the aforementioned layers are deposited on the anode 61, thereby forming the first hole transporting layer 62.

Holes injected from the anode 61 of the organic EL element 60 and electrons injected from the cathode 67 thereof recombine with each other inside the luminescent layer 64, and exitons are produced by exciting the organic molecules forming the luminescent layer 64. And in the process of radiation deactivation of the excitons, light emanates from the luminescent layer 64, and the organic EL element 60 thus emits the light as the light is released outside from the transparent anode 61 thereof through the transparent insulating substrate.

In this manner, the electric charge applied from the source electrode 13s of the first TFT 30 is stored in the storage capacitance 90 and at the same time applied to the gate electrode 42 of the second TFT 40, and the organic EL element 60 emits the light according to the voltage thereof. It is to be noted that signals used by the organic EL apparatus are supplied from terminals disposed on one end of its periphery. The voltage to the cathode 67 of the organic EL element 60 is also inputted from a terminal.

Hereunder the features of the present invention are described based on the structure of each display pixel of the organic EL display apparatus described above. According to a preferred embodiment of the present invention, an aluminum-neodymium alloy is used as wiring material for the signal lines and scanning lines which drive the TFT included in each display pixel of an active-matrix type organic EL display apparatus, and is also used as the drive power lines which supply power to the organic EL elements thereof. Moreover, a multi-layer structure is implemented so that the aluminum-neodymium alloy is sandwiched by a molybdenum metal on both the upper and the lower side thereof.

Figure 1:
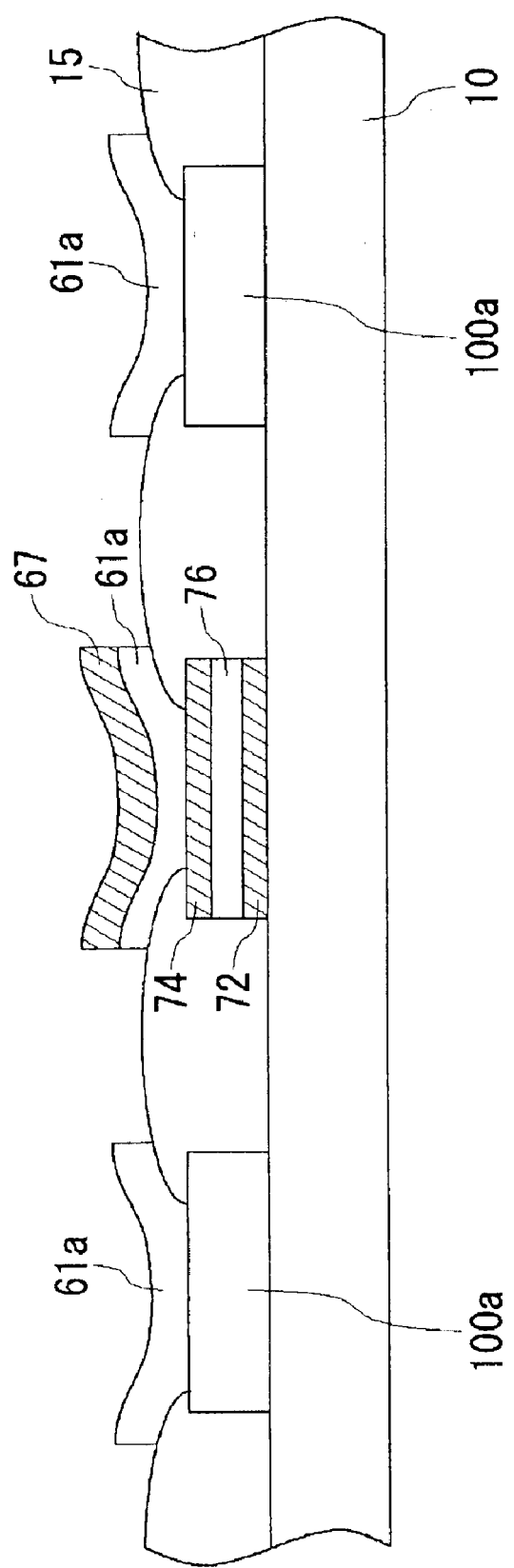
FIG. 1 shows a cross-sectional view of wiring having a multi-layer structure according to an embodiment of the present invention.
Figure 8A:
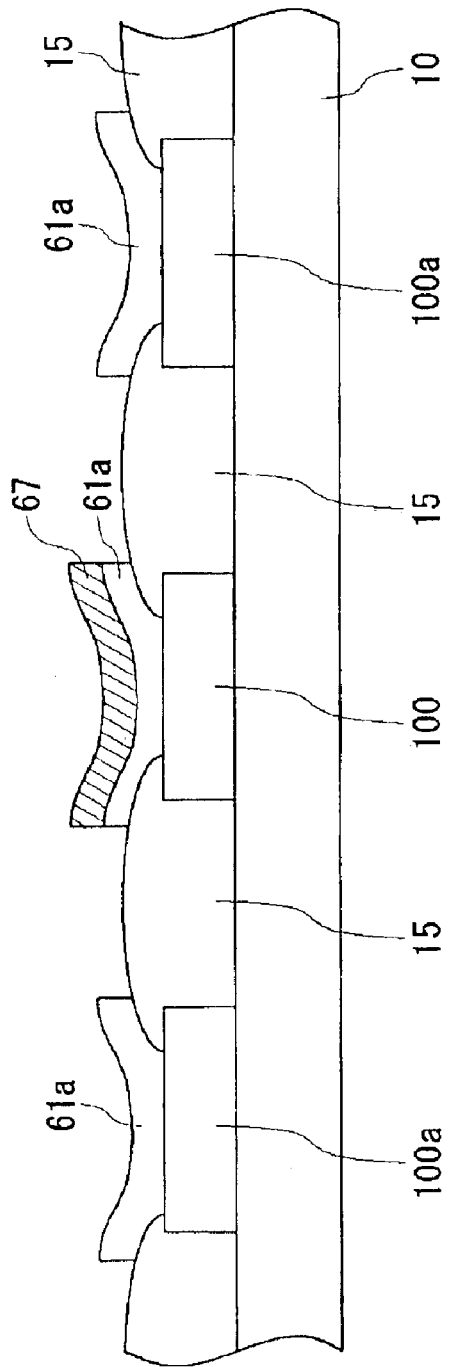
FIG. 8A is a cross-sectional view along line A—A in FIG. 7.
Figure 8B:
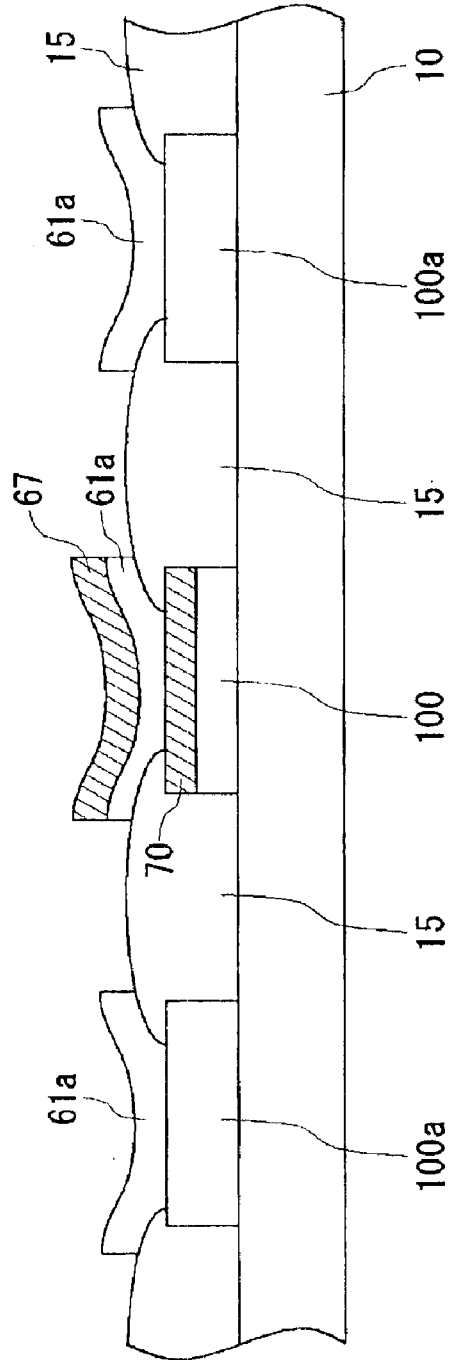
FIG. 8B shows a structure where a refractory metal is provided between an ITO film and a terminal of the wiring structure shown in FIG. 8A.

FIG. 1 shows a cross-sectional view of wiring having the above-described multi-layer structure. The structure shown in FIG. 1 is such that in the cross-sectional structure shown in FIG. 8B, in particular, molybdenum is used for the refractory metal 70, and a layer of molybdenum which is a refractory metal is further provided between the insulating substrate 10 and the first terminal 100 made of aluminum.

Referring to FIG. 1, a first molybdenum layer 72 which is a molybdenum film, an aluminum conductive layer 76 which is an aluminum-neodymium alloy film, and a second molybdenum layer 74 which is a molybdenum film are stacked from bottom to top on the insulating substrate 10 made of glass.

From the viewpoint of electromigration, the reliability in the control of electromigration improves although the resistivity increases by adding neodymium to aluminum. Moreover, from the viewpoint of stressmigration, the provision of the first molybdenum layer 72 on the insulating substrate 10, which is made of glass, gives a heat dissipating function thereto, thereby improving the reliability in the control of stressmigration due to thermal stress.

Shown below are preferable thickness ranges for the three layers described above:
First molybdenum layer 72: 20 to 200 nm.
Aluminum conductive layer 76: 300 to 1000 nm.
Second molybdenum layer 74: 20 to 200 nm.
By the use of the respective layers within the thickness ranges as listed above, the wire structure will display excellent resistance to stressmigration.

Figure 4:
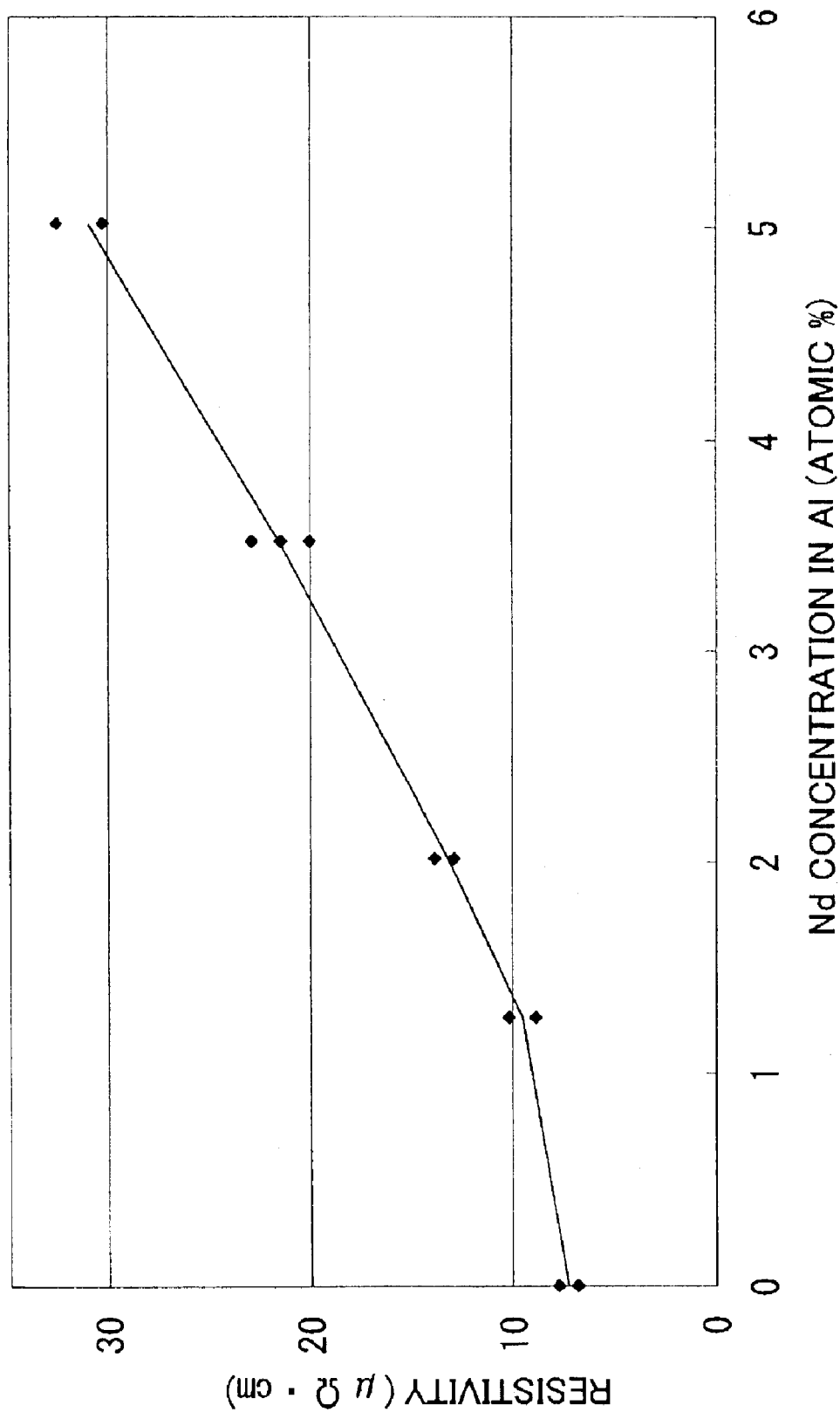
FIG. 4 is a characteristic diagram of measured results showing a relationship between the neodymium concentration in an aluminum wiring and the resistivity of the wiring.

FIG. 4 is a characteristic diagram of measured results showing a relationship between the neodymium concentration in the aluminum conductive layer 76 and the resistivity thereof. As test conditions employed, the aluminum conductive layer 76 was formed as a single layer wiring of 200 nm film thickness, and five kinds, namely, 0, 1.3, 2.0, 3.5 and 5.0 atomic %, were used as the concentration of neodymium contained in the aluminum. In the characteristic diagram of FIG. 4, the horizontal axis represents the concentration of neodymium contained in aluminum, and the vertical axis represents the resistivity of wiring. This concentration was measured by a secondary-ion mass spectrometry.

When the concentration of neodymium is 0, 1.3, 2.0, 3.5 and 5.0 atomic %, the resistivity is 9.6, 13.5, 21.5 and 31.4 $\mu\Omega$·cm, respectively. And a linear relationship becomes evident at 1.3 atomic % or above of neodymium concentration, and the resistivity increases further linearly with respect to the concentration at 2.0 atomic % or above thereof.

A verification concerning the electromigration of the wiring used in the measurements is as follows. The results obtained show that the reliability of this wiring is sufficient when the neodymium concentration is 2.0 atomic % or above whereas the reliability thereof is lost when the neodymium concentration is below 1.3 atomic %. Thus, a lower limit of the concentration of neodymium contained in the aluminum is preferably to be set at 1.3 atomic % or above, and is more preferably at 2.0 atomic % or above.

An upper limit of the neodymium concentration, on the other hand, is subject to a restriction that is relative to the rise in resistivity of wiring. When the resistivity is large, the use of longer wiring will result in greater potential difference between both ends of the wiring, so that a uniform luminance may not be achieved over the whole display screen. Moreover, the product of parasitic capacitance between wirings and the resistance value exerts an adverse effect on the quality of displayed images and the contrast ratio thereof. For this reason also, the resistivity is preferred to be small.

Hence, the upper limit of neodymium concentration that can be permitted by the panel size of a display apparatus is so determined as to suppress the upper limit of resistivity of the wiring. In actual fabrication, the resistivity of up to approximately 30 $\mu\Omega$·cm is permitted for the panel size of 2 to 5 inches, which means the neodymium concentration of up to approximately 5.0 atomic % is permissible. When the panel size is as large as 15 inches, however, the resistivity is to be set at 15 $\mu\Omega$·cm or below and accordingly the neodymium concentration is to be set at 2.5 atomic % or below.

Figure 5:
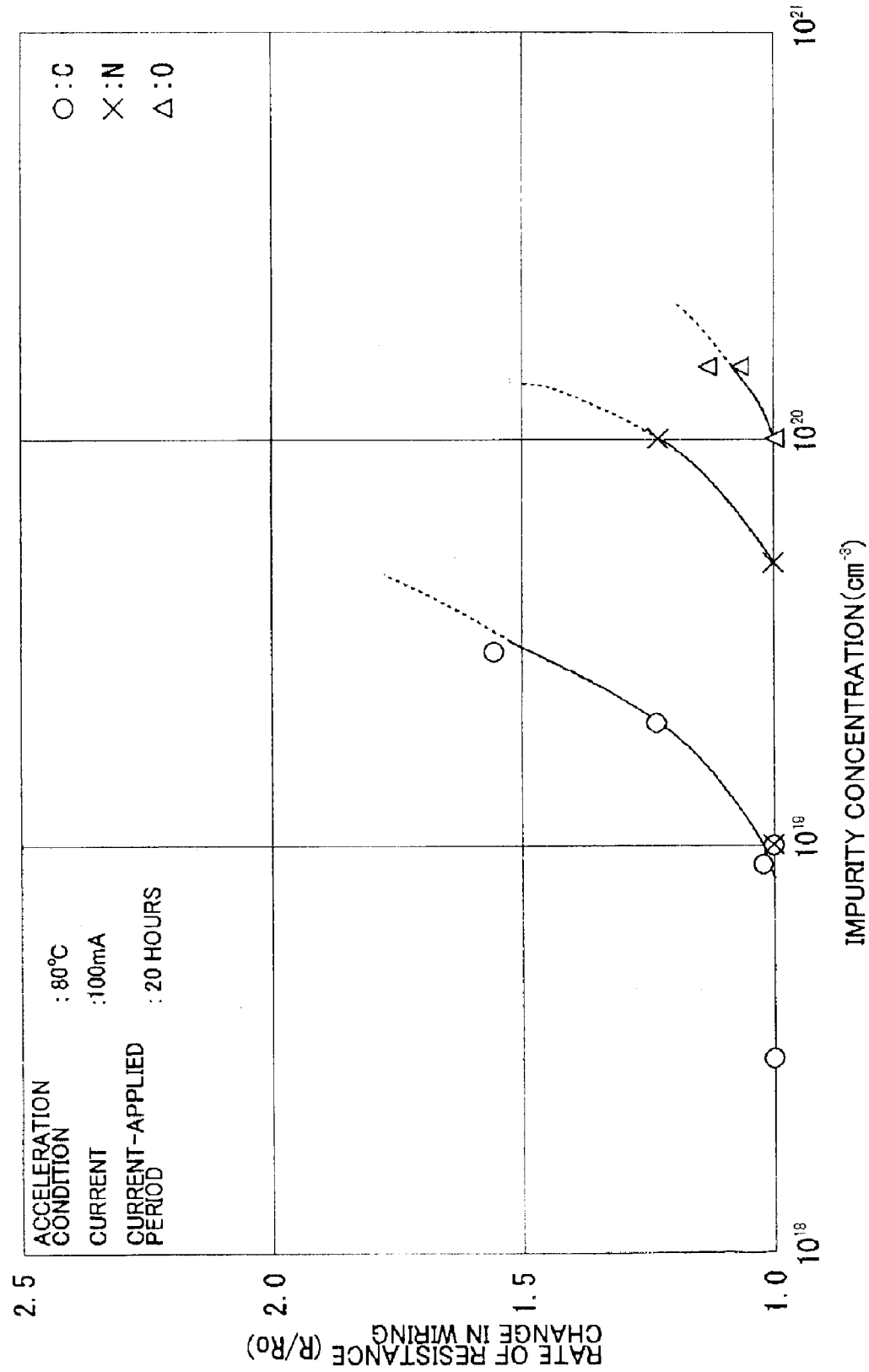
FIG. 5 is a characteristic diagram showing a relationship between the concentrations of oxygen, nitrogen and carbon atoms existing in the aluminum wiring as impurities and the rate of resistance change of the wiring.

FIG. 5 is a characteristic diagram showing a relationship between the concentration of impurities contained in the wiring and the rate of resistance change in the wiring resistance. The numbers of oxygen, nitrogen and carbon atoms per unit volume that are admissible as impurities are determined from the relationship shown therein. These impurities generally mix into the wiring during a lamination process thereof. Here, a resistance value in the initial state before energizing is defined as a reference resistance value $R_0$.

The horizontal axis of the characteristic diagram represents the impurity concentration in natural logarithm, and the vertical axis thereof represents the rate of resistance change in the wiring. Here, the film thickness of the first molybdenum layer 72, the aluminum conductive layer 76 and the second molybdenum layer 74 shown in FIG. 1 were each 200 nm and the width of the wiring was 5 $\mu$m. Moreover, the concentration of neodymium in the aluminum conductive layer 76 was 2.0 atomic %. As for the measuring conditions employed, the temperature was 80° C. as an acceleration condition, the current applied was 100 mA, and the current-applied period was 20 hours. This concentration was measured by the secondary-ion mass spectrometry.

The rate of resistance change in the wiring was observed to rise from around the concentrations of oxygen, nitrogen and carbon atoms of $1\times10^{20}$, $5\times10^{19}$ and $1\times10^{19}$ atomic %, respectively. Hence, it turns out appropriate that the above-mentioned values be set as upper limits of impurity concentration for these elements.

Figure 6:
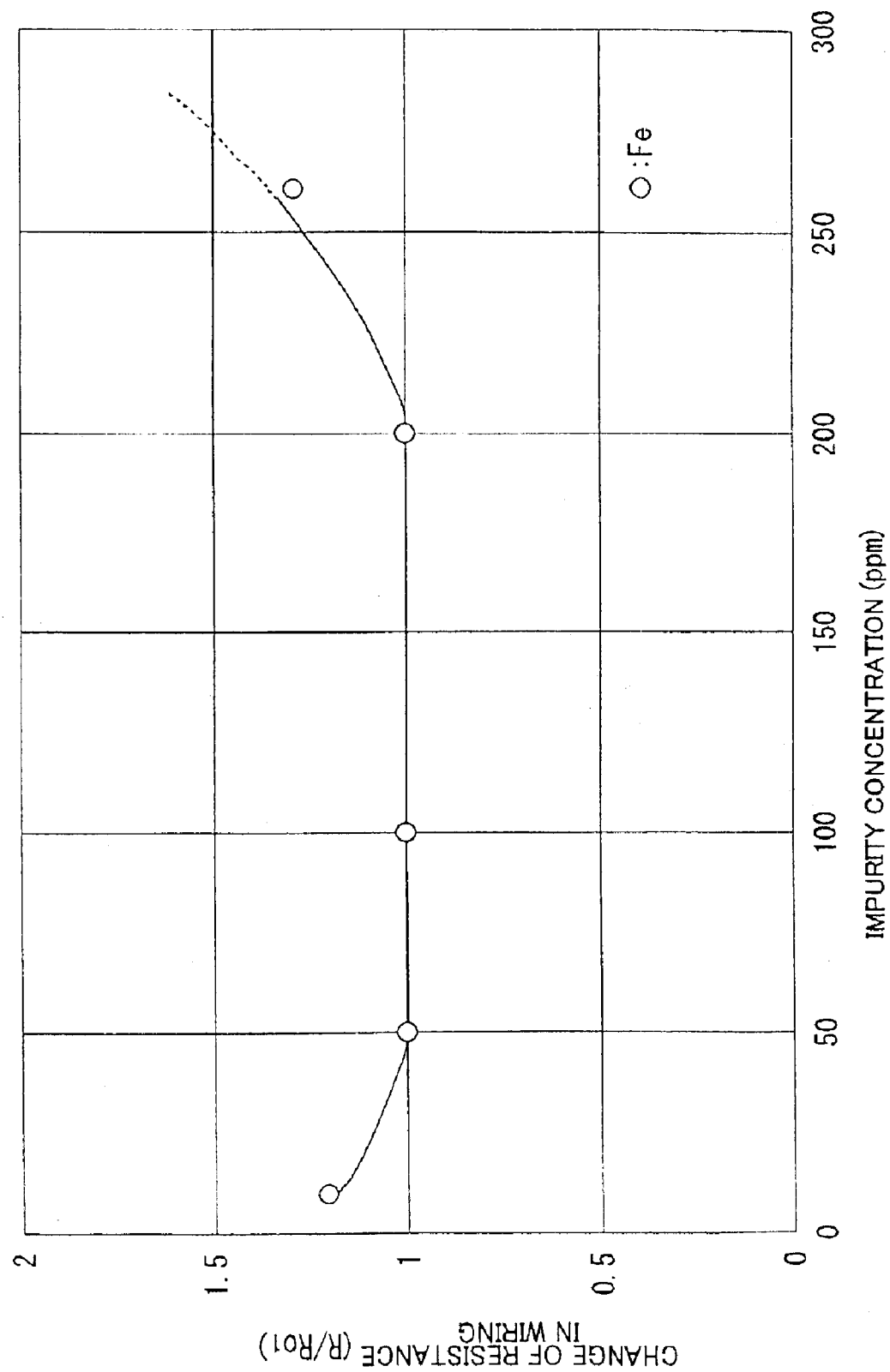
FIG. 6 is a characteristic diagram showing a relationship between the concentration of iron existing in the wiring film as impurity and the resistivity of the wiring.
Figure 7:
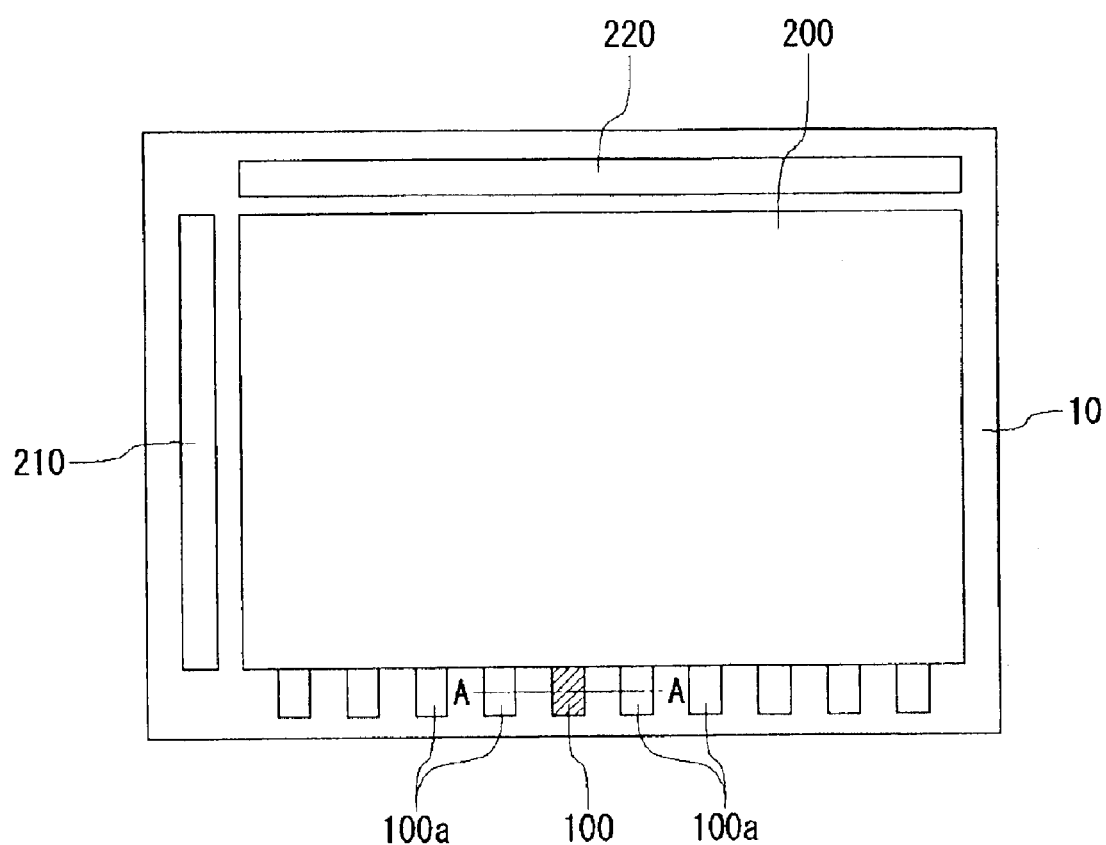
FIG. 7 is a plan view of an active-matrix type organic EL display apparatus.

Similar to FIG. 5, FIG. 6 is a characteristic diagram showing a relationship between the concentration of iron contained in the wiring film and the rate of resistance change of the wiring resistance. Here, the concentrations of the above-mentioned oxygen, nitrogen and carbon atoms were set at $1\times10^{19}$ atomic % or below, respectively. The resistance value was at a minimum between the iron concentrations of 50 and 200 ppm, so that using this resistance value as a reference resistance value $R_{01}$, the resistance change $R/R_{01}$ which is the ratio of resistance value R at different iron concentrations thereto was obtained. At a low iron concentration of 5 ppm, the resistance change is 1.2 with a 20% rise in resistance value. Also, at a high iron concentration of 260 ppm, the resistance change is 1.3 with a 30% rise in resistance value. Therefore, it is preferable that the concentration of iron as an impurity be in the range of 50 ppm to 200 ppm. The iron concentration was also measured by the secondary-ion mass spectrometry.

According to the preferred embodiments of the present invention as described above, a highly reliable wiring is realized by implementing a multi-layer structure where aluminum-neodymium alloy is sandwiched between molybdenum alloys and by properly setting the concentration of impurities contained in the aluminum-neodymium alloy. Moreover, by the use of this wiring structure, an organic EL display apparatus appropriate for high-speed moving pictures can be realized.

The present invention has been described based on embodiments which are only exemplary. It is understood by those skilled in the art that there exist other various modifications to the combination of each component and process described above and that such modifications are encompassed by the scope of the present invention.

In the above embodiment as shown in FIG. 1, the wiring structure according to the present invention is applied to the first terminal 100 only, but may also be applied to the second terminal 100a. Moreover, the wiring structure according to the present embodiments may be applied to an inorganic EL display apparatus and so forth.

Although the present invention has been described by way of exemplary embodiments, it should be understood that many changes and substitutions may further be made by those skilled in the art without departing from the scope of the present invention which is defined by the appended claims.

What is claimed is:

1. A display apparatus, including:
    a multi-layer structured wiring which comprises:
        an insulating substrate;
        a first conductive layer, formed on said insulating substrate, which is made of a refractory metal;
        a second conductive layer, formed on said first conductive layer, which is made of an aluminum alloy; and
        a third conductive layer, formed on said second conductive layer, which is made of a refractory metal.

2. A display apparatus according to claim 1, wherein said wiring is connected to a current-driven type optical element.

3. A display apparatus according to claim 1, wherein said first conductive layer and said third conductive layer are made of material containing a metal which belongs to group 6A.

4. A display apparatus according to claim 3, wherein the metal belonging to group 6A is molybdenum.

5. A display apparatus according to claim 1, wherein the aluminum alloy in said second conductive layer is aluminum-neodymium alloy containing a neodymium element.

6. A display apparatus according to claim 5, wherein said second conductive layer is such that concentration of neodymium therein is substantially greater than or equal to 2 atomic %.

7. A display apparatus according to claim 1, wherein a weight-converted concentration of iron contained in said second conductive layer as impurity is in a range of substantially 50 ppm to 200 ppm.

8. A display apparatus according to claim 1, wherein concentrations of oxygen, nitrogen and carbon elements contained in said second conductive layer as impurities are substantially less than or equal to $1\times10^{20}$ cm$^{-3}$, $5\times10^{19}$ cm$^{-3}$, and $1\times10^{19}$ cm$^{-3}$, respectively.

9. A display apparatus according to claim 2, wherein said first conductive layer and said third conductive layer are made of material containing a metal which belongs to group 6A.

10. A display apparatus according to claim 8, wherein the metal belonging to group 6A is molybdenum.

11. A display apparatus according to claim 2, wherein the aluminum alloy in said second conductive layer is aluminum-neodymium alloy containing a neodymium element.

12. A display apparatus according to claim 10, wherein said second conductive layer is such that concentration of neodymium therein is substantially greater than or equal to 2 atomic %.

13. A display apparatus according to claim 2, wherein a weight-converted concentration of iron contained in said second conductive layer as impurity is in a range of substantially 50 ppm to 200 ppm.

14. A display apparatus according to claim 2, wherein concentrations of oxygen, nitrogen and carbon elements contained in said second conductive layer as impurities are substantially less than or equal to $1\times10^{20}$ cm$^{-3}$, $5\times10^{19}$ cm$^{-3}$, and $1\times10^{19}$ cm$^{-3}$, respectively.

15. A display apparatus according to claim 3, wherein the aluminum alloy in said second conductive layer is aluminum-neodymium alloy containing a neodymium element.

16. A display apparatus according to claim 8, wherein the aluminum alloy in said second conductive layer is aluminum-neodymium alloy containing a neodymium element.

17. A display apparatus according to claim 4, wherein the aluminum alloy in said second conductive layer is aluminum-neodymium alloy containing a neodymium element.

18. A display apparatus according to claim 9, wherein the aluminum alloy in said second conductive layer is aluminum-neodymium alloy containing a neodymium element.

19. A display apparatus according to claim 18, wherein a weight-converted concentration of iron contained in said second conductive layer as impurity is in a range of substantially 50 ppm to 200 ppm.

20. A display apparatus according to claim 19, wherein concentrations of oxygen, nitrogen and carbon elements contained in said second conductive layer as impurities are substantially less than or equal to $1\times10^{20}$ cm$^{-3}$, $5\times10^{19}$ cm$^{-3}$, and $1\times10^{19}$ cm$^{-3}$, respectively.

* * * * *